US009490172B2

(12) United States Patent
Briere

(10) Patent No.: US 9,490,172 B2
(45) Date of Patent: Nov. 8, 2016

(54) METHOD FOR PREVENTING DELAMINATION AND CRACKS IN GROUP III-V WAFERS

(71) Applicant: Infineon Technologies Americas Corp., El Segundo, CA (US)

(72) Inventor: Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/945,338

(22) Filed: Nov. 18, 2015

(65) Prior Publication Data

US 2016/0071768 A1 Mar. 10, 2016

Related U.S. Application Data

(62) Division of application No. 14/191,910, filed on Feb. 27, 2014, now Pat. No. 9,196,688.

(60) Provisional application No. 61/773,050, filed on Mar. 5, 2013.

(51) Int. Cl.
*H01L 21/00* (2006.01)
*H01L 21/78* (2006.01)
*H01L 29/20* (2006.01)
*H01L 21/02* (2006.01)
*H01L 23/00* (2006.01)

(52) U.S. Cl.
CPC ......... *H01L 21/78* (2013.01); *H01L 21/02002* (2013.01); *H01L 21/0242* (2013.01); *H01L 21/0254* (2013.01); *H01L 21/02373* (2013.01); *H01L 21/02538* (2013.01); *H01L 23/562* (2013.01); *H01L 29/2003* (2013.01)

(58) Field of Classification Search
CPC ........... H01L 33/641; H01L 21/02002; H01L 21/02373; H01L 21/0242
USPC ........................................ 438/462
See application file for complete search history.

(56) References Cited

U.S. PATENT DOCUMENTS

2008/0265265 A1* 10/2008 Xiong ................... H01L 33/641
257/97

\* cited by examiner

*Primary Examiner* — Douglas Menz
(74) *Attorney, Agent, or Firm* — Murphy, Bilak & Homiller, PLLC

(57) ABSTRACT

In an exemplary implementation, a method includes growing a III-Nitride body over a group IV substrate in a semiconductor wafer. The method includes forming at least one device layer over the III-Nitride body. The method also includes etching grid array trenches in the III-Nitride body, where the etching of the grid array trenches may extend into the group IV substrate. The method can also include forming an edge trench around a perimeter of the semiconductor wafer. The method further includes forming separate dies by cutting the semiconductor wafer approximately along the grid array trenches.

16 Claims, 6 Drawing Sheets

Fig. 2A Top View
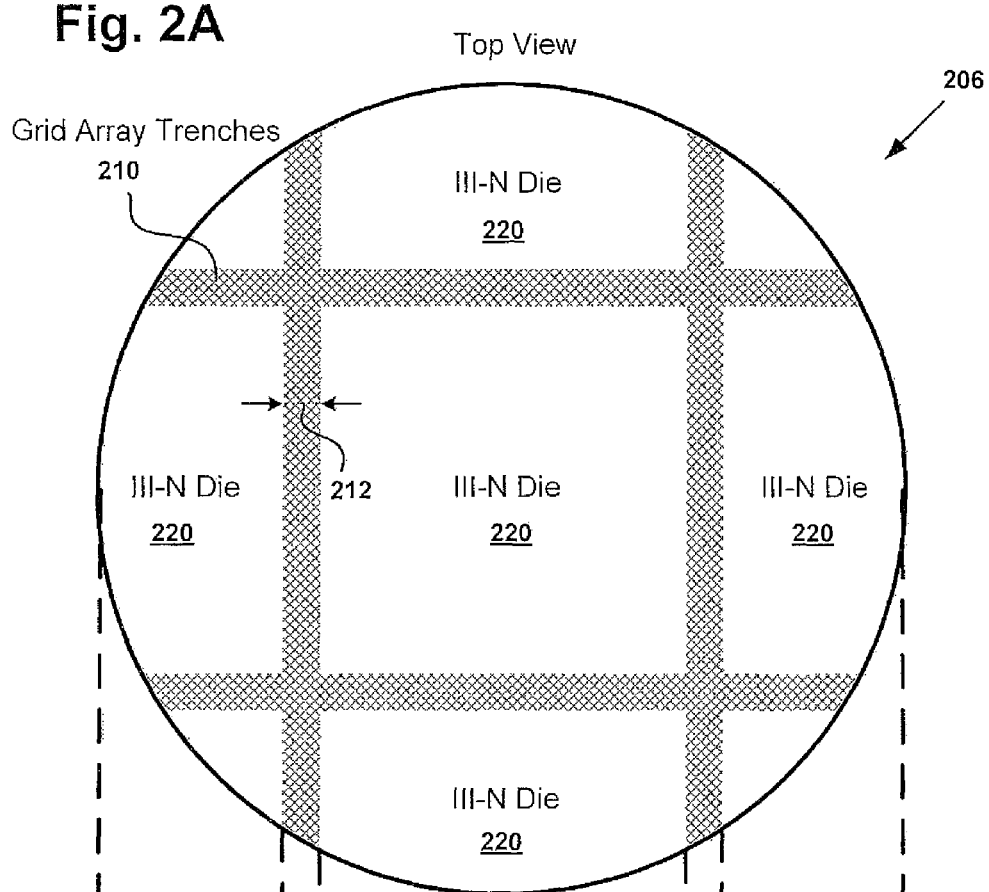
Fig. 2B Side View
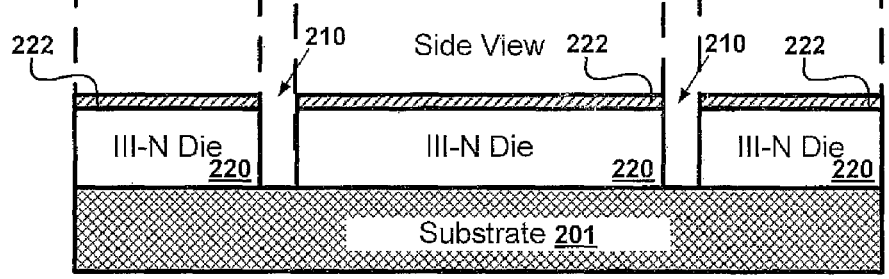

US 9,490,172 B2

METHOD FOR PREVENTING DELAMINATION AND CRACKS IN GROUP III-V WAFERS

This is a divisional of application Ser. No. 14/191,910 filed Feb. 27, 2014, which itself claims benefit of and priority to U.S. Provisional Patent Application Ser. No.61/773,050 filed on Mar. 5, 2013. This disclosure in the above-identified patent applications are hereby incorporated fully by reference into the present application.

BACKGROUND

1. Definition

As used herein, the phrase "group III-V" refers to a compound semiconductor that includes at least one group III element and at least one group V element. By way of example, a group III-V semiconductor may take the form of a III-Nitride semiconductor. "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layers of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

2. Background Art

A group III-V heterostructure field-effect transistor (group III-V HFET), such as group III-V high electron mobility transistor (group III-V HEMT), can include III-Nitride films formed on a non-native substrate, such as group IV substrate (e.g., silicon). Epitaxial growth or deposition of the III-Nitride films on the non-native substrate often results in excessive wafer warpage and bow. Also, deleterious cracking and delamination of the III-Nitride films and/or the non-native substrate may occur. These undesirable results are typically caused by lattice constant mismatches between the III-Nitride films and the non-native substrate, as well as differences in coefficients of thermal expansion between the III-Nitride films and the non-native substrate.

Various approaches have been proposed to accommodate for stresses associated with depositing III-Nitride films on a non-native substrate. One such approach is the use of a compositionally graded transition layer as disclosed in U.S. Pat. No. 6,649,287, entitled "Gallium Nitride Materials and Methods," and issued on Nov. 18, 2003, the disclosure of which is hereby incorporated fully by reference into the present application. Another approach is the use of compositionally graded transition layers as disclosed in U.S. Pat. No. 7,365,374, entitled "Gallium Nitride Material Structures Including Substrates and Methods Associated with the Same," and issued on Apr. 29, 2008, the disclosure of which is hereby incorporated fully by reference into the present application.

An approach that has been proposed to accommodate for stresses associated with epitaxial growth of III-Nitride films on a non-native substrate is to modify the surface of the non-native substrate prior to the epitaxial growth. One such approach is to employ grid arrays or control joints formed in the non-native substrate of a wafer prior to growth of the III-Nitride films. These control joints can be aligned with saw streets for dies and prevent large area coalescence across an entirety of the wafer. The total stress built up across the wafer is thereby reduced, as disclosed in U.S. Pat. No. 8,557,681, entitled "III-Nitride Wafer Fabrication," and issued on Oct. 15, 2013, the disclosure of which is hereby incorporated fully by reference into the present application.

SUMMARY

Delamination and crack prevention in HI-Nitride wafers, substantially as shown in and/or described in connection with at least one of the figures, and as set forth more completely in the claims.

BRIEF DESCRIPTION OF THE DRAWINGS

FIG. 2A illustrates a top plan view of a region of an exemplary semiconductor wafer, according to an implementation disclosed in the present application.

FIG. 2B illustrates a cross-sectional side view of a region of an exemplary semiconductor wafer, according to an implementation disclosed in the present application.

DETAILED DESCRIPTION

Figure 1:
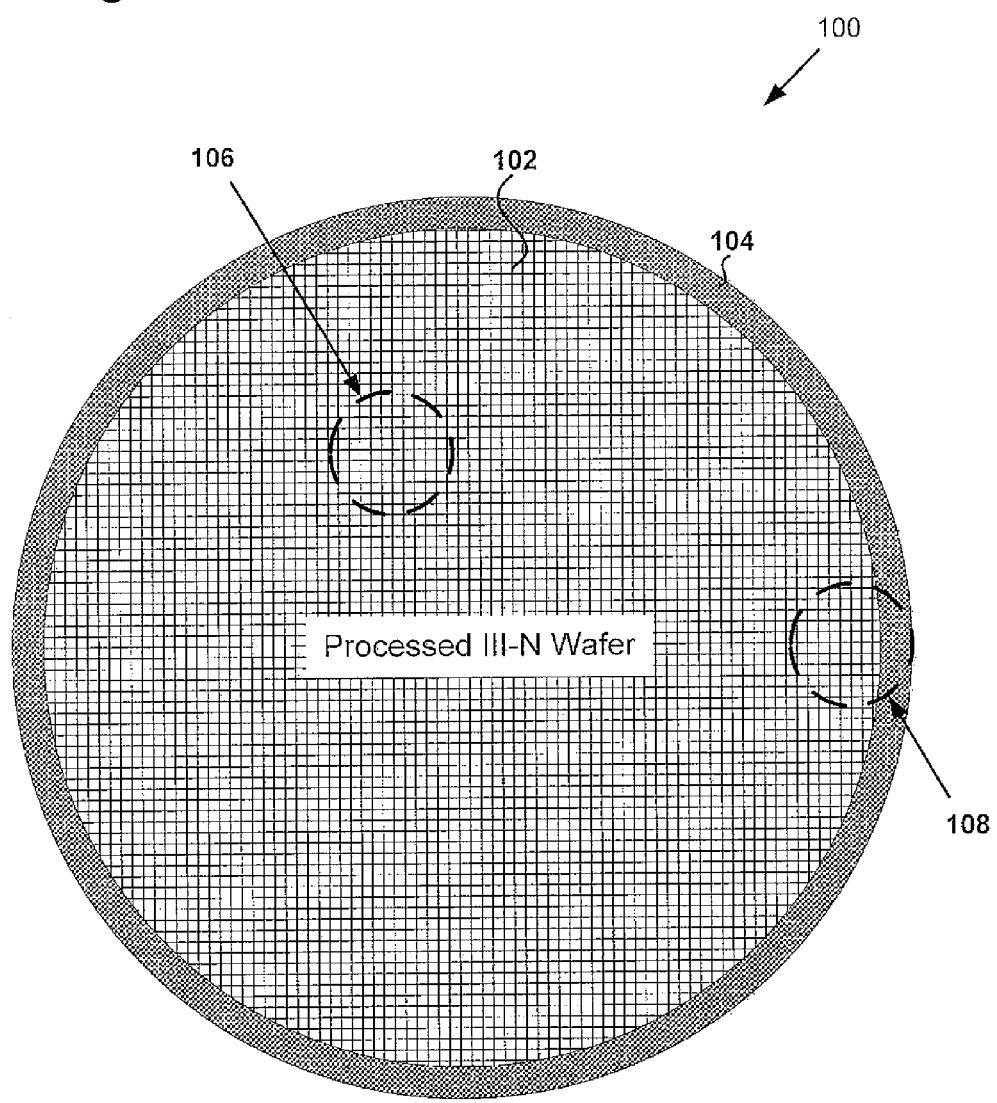
FIG. 1 illustrates a top plan view of an exemplary semiconductor wafer, according to an implementation disclosed in the present application.

The following description contains specific information pertaining to various implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a top plan view of an exemplary semiconductor wafer, according to an implementation disclosed in the present application. In particular, FIG. 1 shows a top plan view of semiconductor wafer 100 having grid array trenches 102 etched across semiconductor wafer 100, and edge trench 104 around a perimeter of semiconductor wafer 100. In an implementation of the present disclosure, semiconductor wafer 100 may be a processed HI-Nitride wafer having a III-Nitride body disposed over a semiconductor substrate, such as a group IV substrate (not explicitly shown in FIG. 1). In addition, one or more device layers, such as one or more post epitaxial device layers (e.g., field dielectric layers, other dielectric layers, and/or metal layers) may be formed over the III-Nitride body (not explicitly shown in FIG. 1).

In accordance with various implementations of the present disclosure, grid array trenches 102 may be aligned with saw streets for forming III-Nitride dies on semiconductor wafer 100. In one implementation, grid array trenches 102 may be approximately ten micrometers (10 um) wide or greater, by way of example. Edge trench 104 may be formed on the edge of semiconductor wafer 100. In the present implementation, edge trench 104 may be approximately two millimeters (2 mm) wide or greater, by way of example. Also shown in FIG. 1 are regions 106 and 108, which will be described in greater detail below.

Referring now to FIGS. 2A and 2B, FIG. 2A illustrates a top plan view of a region of an exemplary semiconductor wafer, according to an implementation disclosed in the present application. FIG. 2B illustrates a cross-sectional side view of a region of an exemplary semiconductor wafer, according to an implementation disclosed in the present application.

In particular, FIGS. 2A and 2B show respective top and cross-sectional side views of region 206 having grid array trenches 210, which may correspond to an enlarged view of region 106 of semiconductor wafer 100 in FIG. 1. Region 206 includes substrate 201, III-Nitride body 220 (or more generally "group III-V body 220"), and device layer 222 (e.g., one or more post epitaxial device layers, such as field dielectric layers, and/or other dielectric layers). Region 206 may also include grid array trenches 210 corresponding to grid array trenches 102 of FIG. 1.

Substrate 201 may be a group IV substrate that includes at least one group IV element such as silicon (Si), germanium (Ge), and carbon (C), and may also include compound semiconductors such as silicon germanium (SiGe) and silicon carbide (SiC), for example. Substrate 201 may also be a group IV substrate that includes more than one layer of group IV elements, and/or doped group IV elements to produce strained group IV materials. Substrate 201 may also be a group IV substrate that is a composite substrate, such as a silicon-on-insulator (SOI) substrate, a separation by implantation of oxygen (SIMOX) substrate, or a silicon-on-sapphire (SOS) substrate, for example.

III-Nitride body 220, which is formed on substrate 201, may include multiple III-Nitride films, such as an intermediate layer (e.g., an aluminum nitride (AlN) intermediate layer), a transition layer (e.g., an aluminum gallium nitride (AlGaN) transition layer), and III-Nitride device layers forming a heterojunction near an interface therebetween (e.g., a heterojunction formed by an interface of aluminum gallium nitride (AlGaN) and gallium nitride (GaN)). III-Nitride body 220 can be grown over substrate 201 (e.g. a group IV substrate). For example, III-Nitride body 220 can be epitaxially grown on substrate 201.

As illustrated in FIG. 2B, device layer 222 may be formed over III-Nitride body 220. In one implementation, device layer 222 includes one or more post epitaxial device layers, such as field dielectric layers, other dielectric layers, metal layers, and/or semiconductor layers. For example, device layer 222 can include dielectric layers and/or metal layers used in back end process steps of a semiconductor wafer.

As shown in FIGS. 2A and 2B, grid array trenches 210 are formed in III-Nitride body 220 defining a plurality of III-Nitride dies in a semiconductor wafer (e.g. semiconductor wafer 100 of FIG. 1). For example, grid array trenches 210 can be etched in III-Nitride body 220. Grid array trenches 210 can be etched in III-Nitride body 220 to form a plurality of III-Nitride dies, as shown in FIGS. 2A and 2B. Device layer 222 is formed over each of the plurality of III-Nitride dies. The plurality of III-Nitride dies can be separated by cutting the semiconductor wafer (e.g. semiconductor wafer 100 of FIG. 1) approximately along grid array trenches 210, thereby forming separate dies.

Grid array trenches 210 may include trenches of width 212. In accordance with an implementation of the present disclosure, width 212 may be approximately 10 um or greater. In one implementation, grid array trenches 210 are substantially aligned with the dicing streets across the III-Nitride wafer (e.g. semiconductor wafer 100 of FIG. 1). By way of example, dicing streets associated with mechanical sawing may have a width of 50 microns or more depending on the kerf width of the saw blade. As such, width 212 of grid array trenches 210 may be less than the width of the dicing streets, may be approximately equal to the dicing street width, or may be greater than the dicing street width. In another implementation, grid array trenches 210 are not entirely aligned with the dicing streets. Additional trenches or control joints may also be included in the HI-Nitride wafer.

As can be seen in FIG. 2B, according to the present implementation, grid array trenches 210 extends down through device layer 222 and III-Nitride body 220, and terminates at a top surface of substrate 201. In another implementation, grid array trenches 210 may not terminate on the top surface of substrate 201, but rather may extend down into substrate 201. In yet another implementation, grid array trenches 210 may terminate within III-Nitride body 220 (e.g., at an underlying AlGaN transition layer or AlN intermediate layer formed below the III-Nitride device layers).

As shown in FIG. 2B, grid array trenches 210 may begin at a top surface of device layer 222 and extend into III-Nitride body 220. It may be advantageous or desirable to form device layer 222, such as one or more post epitaxial device layers (e.g., field dielectric layers, other dielectric layers, metal layers, and/or semiconductor layers) or a combination of layers, prior to forming grid array trenches 210. In another implementation, grid array trenches 210 may be formed at a top surface of III-Nitride body 220 prior to the formation of device layer 222, where device layer 222 is formed after grid array trenches 210 are etched in III-Nitride body 220. In still other implementations, grid array trenches 210 may be formed through one or more layers in device layer 222 and prior to the deposition or formation of additional layers in device layer 222.

The formation and processing of device layer 222 may increase the total stress on III-Nitride films of III-Nitride body 220 due to added mismatches in thermal expansion. Moreover, in some implementations, device layer 222 requires elevated deposition or annealing temperatures, as well as rapid changes in temperature that increases the total stress on the III-Nitride films. Increasing the total stress on the III-Nitride films can cause delamination and or cracking during subsequent processing and handling of a semiconductor wafer (e.g. semiconductor wafer 100 of FIG. 1), including dicing of the semiconductor wafer and die singulation.

Various implementations of the present disclosure alleviate an increase in the total stress on the III-Nitride films that can be caused by the formation and processing of device layer 222. In various implementations, the increase in the total stress is alleviated utilizing grid array trenches 210. Grid array trenches 210 may be aligned with the dicing streets that define the plurality of HI-Nitride dies with III-Nitride body 220. Such grid trenches may act to prevent or otherwise inhibit the propagation of stress induced cracks across the wafer, such as semiconductor wafer 100 in FIG. 1.

Figure 3A:
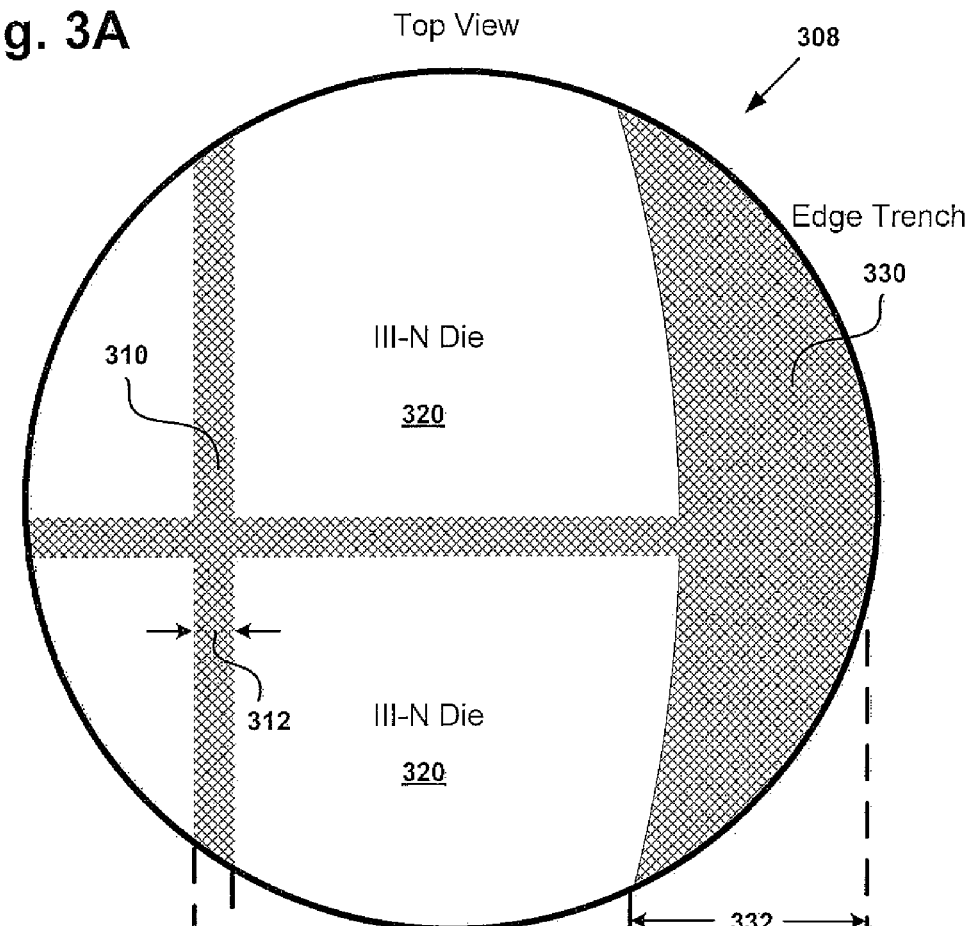
FIG. 3A illustrates a top plan view of a region of an exemplary semiconductor wafer, according to an implementation disclosed in the present application.
Figure 3B:
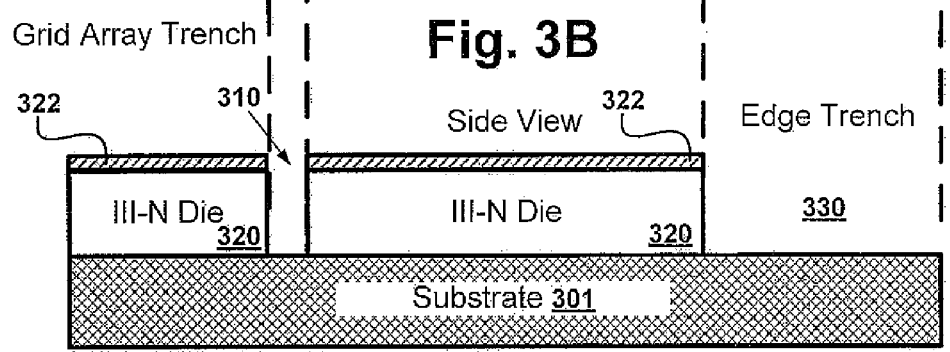
FIG. 3B illustrates a cross-sectional side view of a region of an exemplary semiconductor wafer, according to an implementation disclosed in the present application.

Referring now to FIGS. 3A and 3B, FIG. 3A illustrates a top plan view of a region of an exemplary semiconductor wafer, according to an implementation disclosed in the present application. FIG. 3B illustrates a cross-sectional side view of a region of an exemplary semiconductor wafer, according to an implementation disclosed in the present application.

In particular, FIGS. 3A and 3B show respective top and cross-sectional side views of region 308 having, in part, an edge trench, which may correspond to an enlarged view of region 108 of semiconductor wafer 100 in FIG. 1. Region 308 may include substrate 301, III-Nitride body 320, and device layer 322. Region 308 may also include grid array trenches 310 and edge trench 330 corresponding respectively to grid array trenches 102 and edge trench 104 in FIG. 1.

In one implementation, substrate 301 may be a group IV substrate, substantially similar to substrate 201 in FIG. 2B. III-Nitride body 320 may include multiple III-Nitride layers (not explicitly shown in FIGS. 3A and 3B). In one implementation, III-Nitride body 320 may be substantially similar to III-Nitride body 220 in FIG. 2B. As illustrated in FIG. 3B, device layer 322 may be formed over III-Nitride body 320. In one implementation, device layer 322 may include one or more post epitaxial device layers, such as field dielectric layers, other dielectric layers, metal layers, and/or semiconductor layers.

As illustrated in FIGS. 3A and 3B, width 312 of grid array trenches 310 is significantly less than width 332 of edge trench 330. In accordance with an implementation of the present disclosure, width 332 of edge trench 330 may be approximately 2 mm or greater, whereas width 312 of grid array trenches 310 may be approximately 10 um or greater. Thus, width 312 of grid array trenches 310 is significantly less than width 332 of edge trench 330.

As illustrated in FIG. 3B, edge trench 330 may extend down through device layer 322 and III-Nitride body 320, and terminate at a top surface of substrate 301. However, in another implementation, edge trench 330 does not terminate on the top surface of substrate 301, but rather may extend down into substrate 301. In yet another implementation, edge trench 330 may terminate within III-Nitride body 320 (e.g., at an underlying AlGaN transition layer or MN intermediate layer formed below the III-Nitride device layers). In some implementations, the termination of grid array trenches 310 and edge trench 330 may be substantially coplanar. However, in other implementations, the termination of grid array trenches 310 occurs on a different plane or on a different III-Nitride layer than the termination of edge trench 330.

As shown in FIG. 3B, edge trench 330 may begin at a top surface of device layer 322 and extend into III-Nitride body 320. It may be advantageous or desirable to form device layer 322, such as one or more post epitaxial device layers (e.g., field dielectric layers, other dielectric layers, metal layers, and/or semiconductor layers) or a combination of layers, prior to forming edge trench 330. In another implementation, edge trench 330 may be etched from a top surface of III-Nitride body 320 prior to forming device layer 322 over III-Nitride body 320. In still other implementations, edge trench 330 may be formed through one or more layers in device layer 222 and prior to the deposition or formation of additional layers in device layer 222.

Figure 4A:
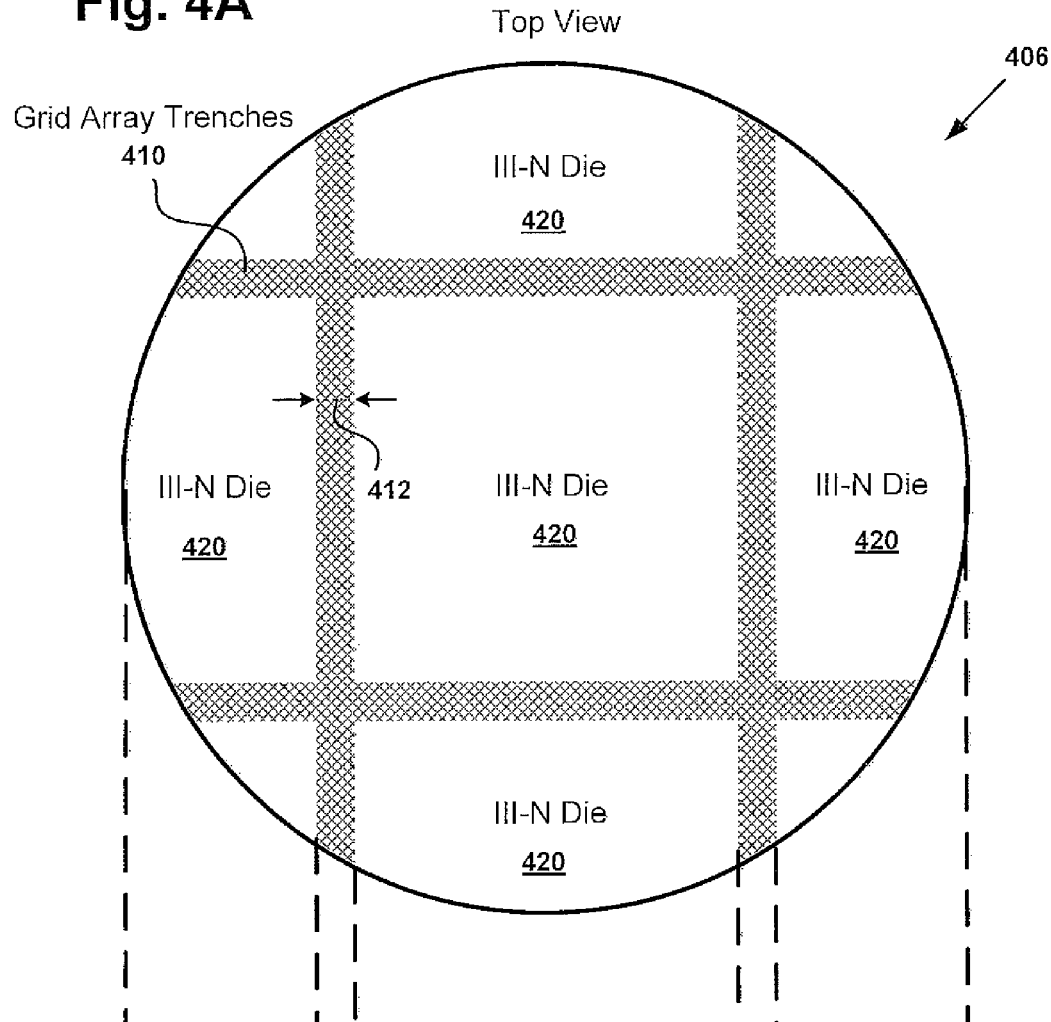
FIG. 4A illustrates a top plan view of a region of an exemplary semiconductor wafer, according to an implementation disclosed in the present application.
Figure 4B:
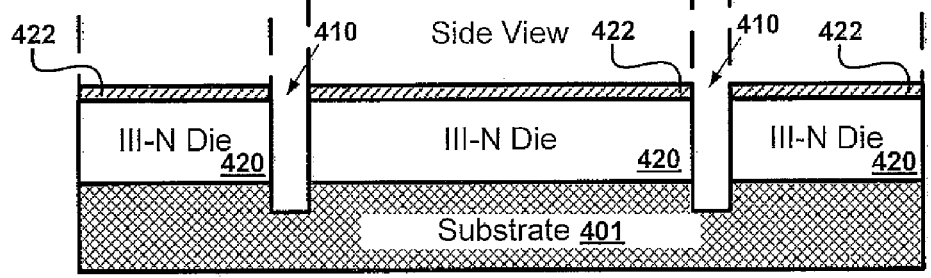
FIG. 4B illustrates a cross-sectional side view of a region of an exemplary semiconductor wafer, according to an implementation disclosed in the present application.

Referring now to FIGS. 4A and 4B, FIG. 4A illustrates a top plan view of a region of an exemplary semiconductor wafer, according to an implementation disclosed in the present application. FIG. 4B illustrates a cross-sectional side view of a region of an exemplary semiconductor wafer, according to an implementation disclosed in the present application.

In particular, FIGS. 4A and 4B show respective top and cross-sectional side views of region 406 having grid array trenches 410, which may correspond to an enlarged view of region 106 of semiconductor wafer 100 in FIG. 1. Region 406 may include substrate 401, III-Nitride body 420, and device layer 422, corresponding respectively to substrate 201, III-Nitride body 220, and device layer 222 of FIGS. 2A and 2B. As can be seen in FIG. 4B, according to the present implementation, grid array trenches 410 can extend down through device layer 422 and III-Nitride body 420, and into substrate 401. For example, grid array trenches 410 can be etched in substrate 401, such that grid array trenches 410 are formed in substrate 401.

Thus, as described above with respect to FIGS. 1, 2A, 2B, 3A, 3B, 4A, and 4B, various implementations of the present application provide for semiconductor wafers having grid array trenches in a III-Nitride body that includes III-Nitride films. The grid array trenches can substantially reduce or prevent stress in the III-Nitride films. In particular, the grid array trenches can substantially reduce or prevent additional stress buildup that may result from device fabrication post epitaxial growth, and can thereby prevent delamination and/or cracking during subsequent processing steps and handling of the semiconductor wafers. Such grid trenches may act to prevent or otherwise inhibit the propagation of stress induced cracks across the wafer 111-Nitride epitaxial wafer.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

Figure 5:
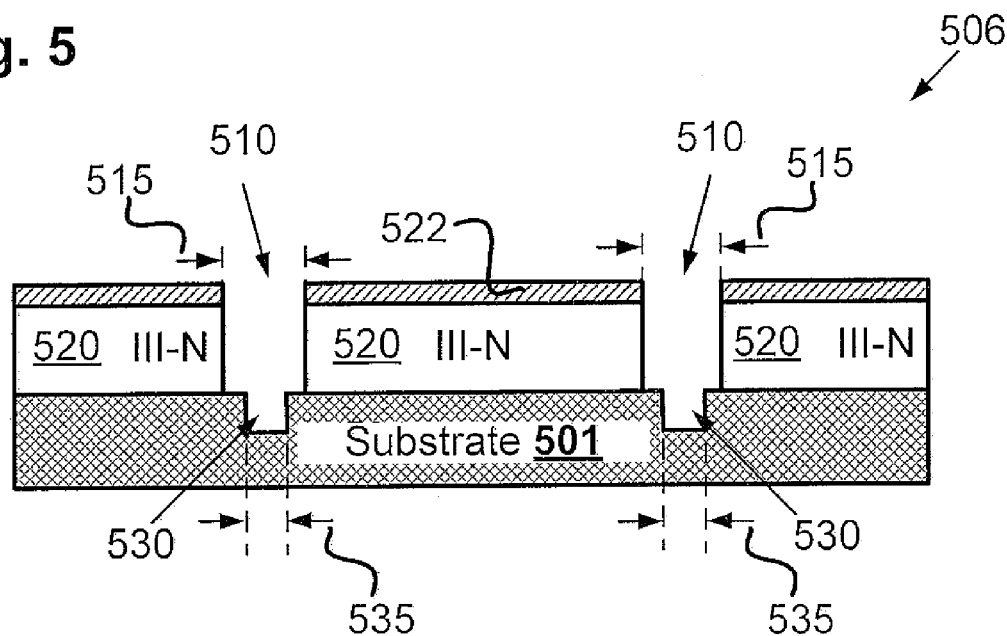
FIG. 5 illustrates a cross-sectional side view of a region of an exemplary semiconductor wafer, according to an implementation disclosed in the present application.

Referring now to FIG. 5, FIG. 5 illustrates a cross-sectional side view of region 506 having, in part, grid array trenches 510 of an exemplary semiconductor wafer, according to an implementation disclosed in the present application. As shown in FIG. 5, region 506 may correspond to an enlarged view of region 106 of semiconductor wafer 100 in FIG. 1. Region 506 may include substrate 501, III-Nitride body 520, and device layer 522, corresponding respectively to substrate 201, III-Nitride body 220, and device layer 222 of FIGS. 2A and 2B. As can be seen in FIG. 5, according to the present implementation, grid array trenches 510 having trench width 515 can extend down through device layer 522 and III-Nitride body 520 and terminate at a top surface of substrate 501. However, in another implementation, grid array trenches 510 do not terminate on the top surface of substrate 501, but rather may extend down into substrate 501. Also shown in FIG. 5 are dicing streets 530 having street width 535. As shown in FIG. 5, trench width 515 of grid array trenches 510 is wider than street width 535 of dicing streets 530. In certain other implementations (not shown), it may be advantageous or desirable to form trench width 515 narrower than or approximately equal to street width 535.

In an implementation, it may be preferable to form grid array trenches 510 using etching techniques commonly known in the art (wet or dry etching, photochemical assisted etching, ion assisted etching, and plasma assisted etching for example). In certain other implementations, it may be preferred to form grid array trenches 510 using either mechanical (sawing) or laser assisted dicing or scribing techniques. In yet another implementation, a combination of etching and laser scribing techniques may be used to form grid array trenches 510.

In another aspect of the present implementation, dicing streets 530 may be formed using a different technique than that used to form grid array trenches 510. For example, in an implementation where substrate 501 is a silicon substrate, it may be preferable to use mechanical dicing (sawing) methods commonly used in volume die singulation processes for manufacturing of silicon based semiconductor engineering and to use an III-Nitride wet etching technique to form grid array trenches 510.

Figure 6:
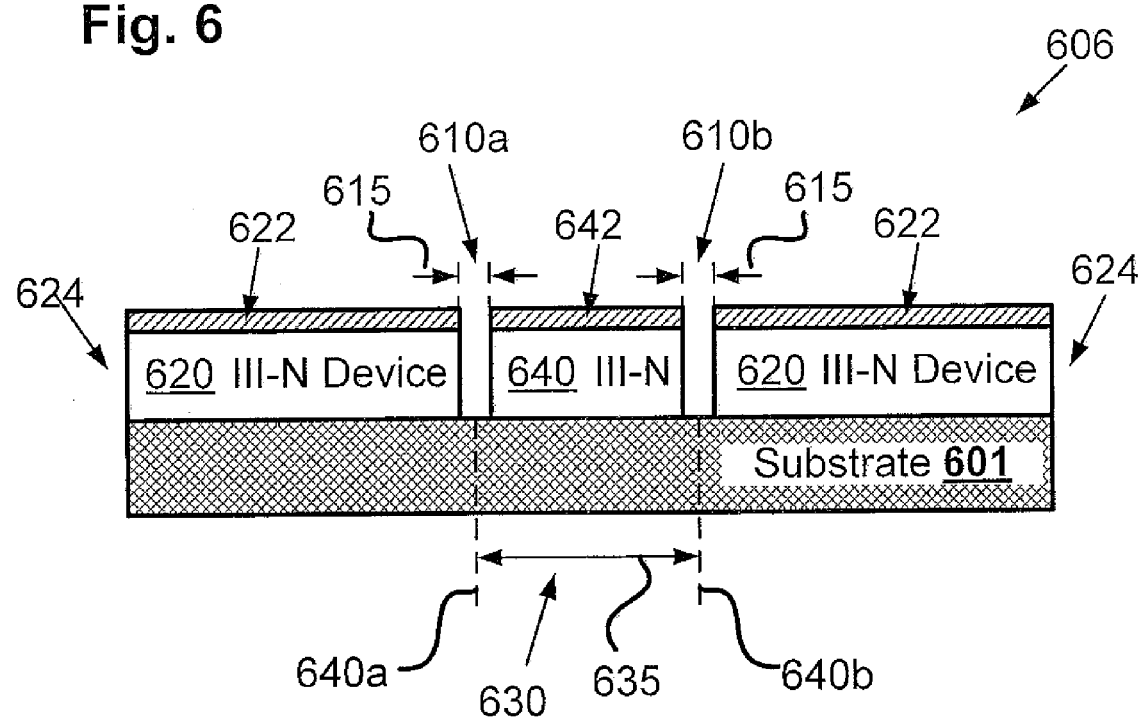
FIG. 6 illustrates a cross-sectional side view of a region of an exemplary semiconductor wafer, according to an implementation disclosed in the present application.

Referring now to FIG. 6, FIG. 6 illustrates a cross-sectional side view of region 606 having, in part, grid array trenches 610a and 610b of an exemplary semiconductor wafer, according to another implementation disclosed in the present application. As shown in FIG. 6, region 606 may include substrate 601, III-Nitride body 620, and device layer 622, corresponding respectively to substrate 201, III-Nitride body 220, and device layer 222 of FIGS. 2A and 2B. As can be seen in FIG. 6, according to the present implementation, grid array trenches 610a and 610b having trench width 615 can extend down through device layer 622 and III-Nitride body 620 and terminate at a top surface of substrate 601. However, in another implementation (not shown), grid array trenches 610a and 610b do not terminate on the top surface of substrate 601, but rather may extend down into substrate 601. Also shown in FIG. 6 is dicing street 630 having street width 635. In particular, in the present implementation shown in FIG. 6, dicing street 630 spans street width 635 defined by endpoints 640a and 640b. Endpoint 640a of dicing street 630 is aligned such that it is located within trench width 615 of grid array trench 610a. Endpoint 640b of dicing street 630 is aligned such that it is located within trench width 615 of grid array trench 610b. As shown in FIG. 6, trench width 615 of grid array trenches 610a and 610b is significantly narrower than street width 635 of dicing street 630. As also shown in FIG. 6, dicing street 630 may include a region which includes substrate 601 as well as sacrificial III-Nitride body 640 and sacrificial device layer 642. In the present implementation, sacrificial III-Nitride body 640 and sacrificial device layer 642 may be formed simultaneously with III-Nitride body 620 and device layer 622. However, sacrificial III-Nitride body 640 and sacrificial device layer 642 are not components of III-Nitride devices 624. Each III-Nitride device 624 includes III-Nitride body 620 and device layer 622.

Figure 7:
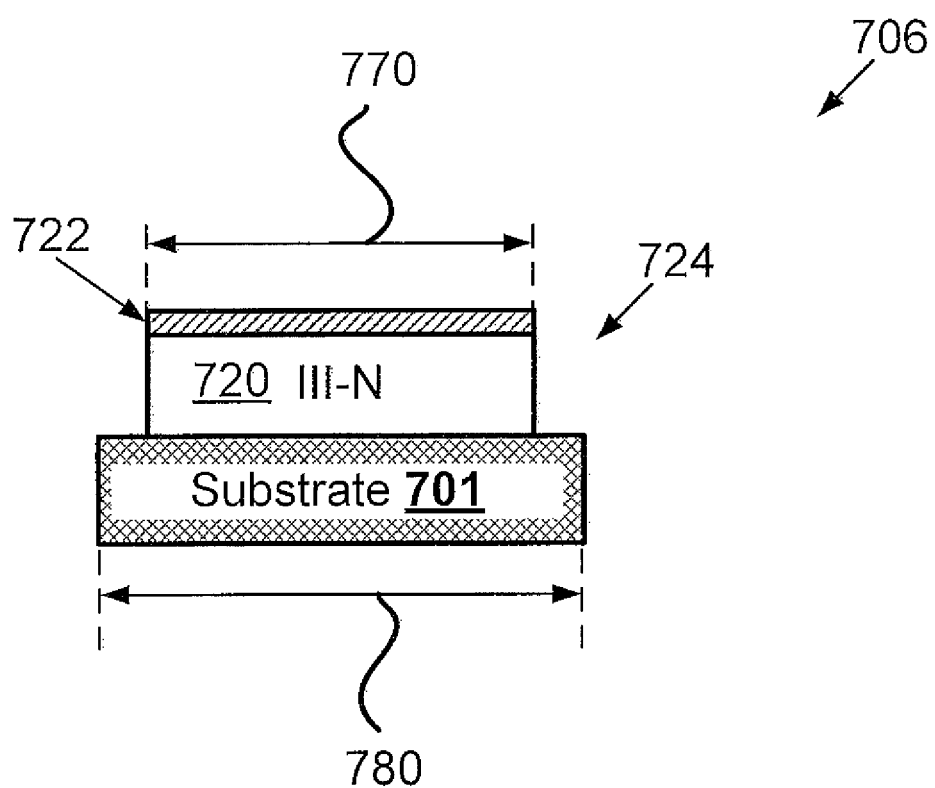
FIG. 7 illustrates a cross-sectional side view of a III-Nitride die of an exemplary semiconductor wafer, according to an implementation disclosed in the present application.

Referring now to FIG. 7, FIG. 7 illustrates a cross-sectional side view of region 706 having III-Nitride device 724, according to an implementation disclosed in the present application. III-Nitride device 724 may correspond to III-Nitride device 624 of region 606 in FIG. 6. As shown in FIG. 7, substrate 701, III-Nitride body 720, and device layer 722 may correspond respectively to substrate 201, III-Nitride body 220, and device layer 222 of FIGS. 2A and 2B. III-Nitride device 724 may have device width 770, and die width 780. Specifically, device width 770 is narrower than die width 780.

The invention claimed is:

1. A method comprising:
   growing a III-Nitride body over a group IV substrate in a semiconductor wafer;
   forming at least one device layer over said III-Nitride body;
   etching grid array trenches in said III-Nitride body;
   forming an edge trench around a perimeter of said semiconductor wafer, said edge trench terminating over a top surface of said group IV substrate;
   forming separate dies by cutting said semiconductor wafer approximately along said grid array trenches.

2. The method of claim 1, further comprising etching said grid array trenches in said group IV substrate.

3. The method of claim 1, wherein said at least one device layer is a metal layer.

4. The method of claim 1, wherein said at least one device layer is a dielectric layer.

5. The method of claim 1, wherein said at least one device layer is a semiconductor layer.

6. The method of claim 1, wherein said group IV substrate is selected from the group consisting of a silicon substrate, a sapphire substrate, a silicon carbide substrate, an SOI substrate, and a SIMOX substrate.

7. A method comprising:
   growing a group III-V body over a group IV substrate in a semiconductor wafer;
   forming at least one device layer over said group III-V body;
   etching trenches in said group III-V body;
   forming an edge trench around a perimeter of said semiconductor wafer, said edge trench terminating over a top surface of said group IV substrate;
   forming separate dies by cutting said semiconductor wafer approximately along said trenches.

8. The method of claim 7, further comprising etching said trenches in said group IV substrate.

9. The method of claim 7, wherein said at least one device layer comprises a metal layer.

10. The method of claim 7, wherein said at least one device layer comprises a dielectric layer.

11. The method of claim 7, wherein said at least one device layer is a semiconductor layer.

12. The method of claim 7, wherein said group IV substrate comprises silicon.

13. The method of claim 7, wherein said group IV substrate comprises sapphire.

14. The method of claim 7, wherein said group IV substrate comprises silicon carbide.

15. The method of claim 7, wherein said group IV substrate comprises an SOI substrate.

16. The method of claim 7, wherein said group IV substrate comprises a SIMOX substrate.

* * * * *